United States Patent
Igarashi

(10) Patent No.: US 11,621,626 B2
(45) Date of Patent: Apr. 4, 2023

(54) DRIVING APPARATUS, SEMICONDUCTOR APPARATUS, AND DRIVING METHOD

(71) Applicant: FUJI ELECTRIC CO., LTD., Kawasaki (JP)

(72) Inventor: Seiki Igarashi, Saitama (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/452,397

(22) Filed: Oct. 26, 2021

(65) Prior Publication Data

US 2022/0190706 A1 Jun. 16, 2022

(30) Foreign Application Priority Data

Dec. 11, 2020 (JP) .............................. JP2020-205998

(51) Int. Cl.
| | |
|---|---|
| H02M 1/08 | (2006.01) |
| H02M 1/34 | (2007.01) |
| H03K 17/16 | (2006.01) |
| H02M 7/537 | (2006.01) |

(52) U.S. Cl.
CPC .............. *H02M 1/08* (2013.01); *H02M 1/348* (2021.05); *H03K 17/162* (2013.01); *H02M 7/537* (2013.01)

(58) Field of Classification Search
CPC ........ H02M 1/08; H02M 1/348; H02M 7/162; H03K 17/162
USPC ................................... 327/108, 109, 110, 111
See application file for complete search history.

(56) References Cited

U.S. PATENT DOCUMENTS

| | | | |
|---|---|---|---|
| 11,031,929 B1* | 6/2021 | Maier | H03K 17/951 |
| 2009/0115255 A1* | 5/2009 | Kumfer | H01H 59/0009 |
| | | | 307/113 |
| 2016/0105103 A1* | 4/2016 | Hwang | H02M 3/156 |
| | | | 323/235 |
| 2016/0182034 A1* | 6/2016 | Wagoner | H03K 17/166 |
| | | | 327/432 |
| 2018/0309438 A1* | 10/2018 | Matsuda | H01L 25/18 |
| 2018/0375508 A1 | 12/2018 | Morisaki | |
| 2019/0064249 A1* | 2/2019 | Yoshida | G01R 31/2608 |
| 2021/0120693 A1* | 4/2021 | Namuduri | H01L 23/24 |
| 2021/0399724 A1* | 12/2021 | Li | H03K 17/04206 |
| 2022/0038018 A1* | 2/2022 | Marcos Pastor | B60L 53/20 |

FOREIGN PATENT DOCUMENTS

| | | |
|---|---|---|
| JP | 2014128066 A | 7/2014 |
| JP | 6597902 B2 | 10/2019 |
| WO | 2017026367 A1 | 2/2017 |

* cited by examiner

*Primary Examiner* — William Hernandez

(57) ABSTRACT

A driving apparatus includes: a driving section configured to drive a control terminal of a semiconductor device according to a control signal input from an outside, the semiconductor device including a first main terminal, a second main terminal, and the control terminal that is configured to control a connection state between the first main terminal and the second main terminal that are connected in parallel with a snubber; and a drive control section configured to lower a drive capability of the driving section during a period in which an inter-main-terminal voltage between the first main terminal and the second main terminal changes by a predetermined reference voltage difference owing to switching of the semiconductor device, compared with other at least some periods.

12 Claims, 8 Drawing Sheets

DRIVING APPARATUS, SEMICONDUCTOR APPARATUS, AND DRIVING METHOD

The contents of the following Japanese patent application are incorporated herein by reference:
No. 2020-205998 filed in JP on Dec. 11, 2020

BACKGROUND

1. Technical Field

The present invention relates to a driving apparatus, a semiconductor apparatus, and a driving method.

2 Related Art

In a power apparatus such as a voltage type inverter including a semiconductor switching device (hereinafter, also referred to as "semiconductor device") such as a metal oxide semiconductor field effect transistor (MOSFET) or an insulated gate bipolar transistor (IGBT), high-frequency voltage and current vibrations are generated when the semiconductor device is switching at a high speed. Patent Literature 1 discloses a vibration suppression circuit 20 added to the outside of a housing 10 of a semiconductor apparatus 100 (paragraph 0018, FIG. 1A, FIG. 1B, FIG. 2, and the like). Patent Literature 2 describes that a resistance value between a control electrode and an output node of a semiconductor switching device is switched to a different value between a case where the semiconductor switching device is turned on and a case where the semiconductor switching device is turned off (claim 1).

CITATION LIST

Patent Literature

Patent Literature 1: Japanese Patent No. 6597902
Patent Literature 2: WO 2017/026367

In recent years, the performance of semiconductor devices has been improved, and high-speed switchable semiconductor devices such as SiC-MOSFETs have also been realized. Therefore, it is desirable to realize a driving system capable of suppressing vibration of the semiconductor device with a low loss even in a case where the semiconductor device is switched at a high speed.

SUMMARY

A first aspect of the present invention provides a driving apparatus. The driving apparatus may include a driving section configured to drive a control terminal of a semiconductor device according to a control signal input from an outside, the semiconductor device including a first main terminal, a second main terminal, and the control terminal that is configured to control a connection state between the first main terminal and the second main terminal that are connected in parallel with a snubber. The driving apparatus may include a drive control section configured to lower a drive capability of the driving section during a period in which an inter-main-terminal voltage between the first main terminal and the second main terminal changes by a predetermined reference voltage difference owning to switching of the semiconductor device, compared with other at least some periods.

In a period in which the semiconductor device is turned off, the drive control section may drive the control terminal at a first drive capability by the driving section while the inter-main-terminal voltage is less than a first threshold. In a period in which the semiconductor device is turned off, the drive control section may drive the control terminal at a second drive capability higher than the first drive capability by the driving section when the inter-main-terminal voltage becomes equal to or higher than the first threshold.

In a period in which the semiconductor device is turned on, the drive control section may drive the control terminal at a third drive capability by the driving section while the inter-main-terminal voltage is equal to or higher than a second threshold. In a period in which the semiconductor device is turned on, the drive control section may drive the control terminal at a fourth drive capability lower than the third drive capability by the driving section when the inter-main-terminal voltage becomes less than the second threshold.

The first threshold and the second threshold may be 60% or more and less than 100% of the inter-main-terminal voltage in a steady state in which the semiconductor device is turned off.

The first threshold and the second threshold may be 80% or more and less than 95% of the inter-main-terminal voltage in a steady state in which the semiconductor device is turned off.

The first threshold and the second threshold may be the same value.

The drive control section may change a drive capability of the control terminal by changing at least one of a magnitude of a resistance of a resistor connected between the control terminal and a reference potential or a capacitance of a capacitor connected between the control terminal and the first main terminal or the second main terminal.

The driving section may include a plurality of driving circuits in which a resistor or a capacitor and a driving switch are each connected in series between a reference potential and the control terminal. The drive control section may change a drive capability of the driving section by switching the driving switch of each of the plurality of driving circuits.

The semiconductor device may be a SiC-MOSFET or a SiC-IGBT.

In a second aspect of the present invention, a semiconductor apparatus is provided. The semiconductor apparatus may include a semiconductor device and a driving apparatus that is configured to drive a control terminal of the semiconductor device.

In a third aspect of the present invention, a driving method is provided. A driving method may include driving, by a driving section, a control terminal of a semiconductor device according to a control signal input from an outside, the semiconductor device including a first main terminal, a second main terminal, and the control terminal that is configured to control a connection state between the first main terminal and the second main terminal that are connected in parallel with a snubber. The driving method may include lowering a drive capability of the driving section during a period in which an inter-main-terminal voltage between the first main terminal and the second main terminal changes by a predetermined reference voltage difference owning to switching of the semiconductor device, compared with other at least some periods.

Note that the above summary of the invention does not enumerate all of the features of the present invention. Further, a sub-combination of these feature groups can also be an invention.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

Figure 1:
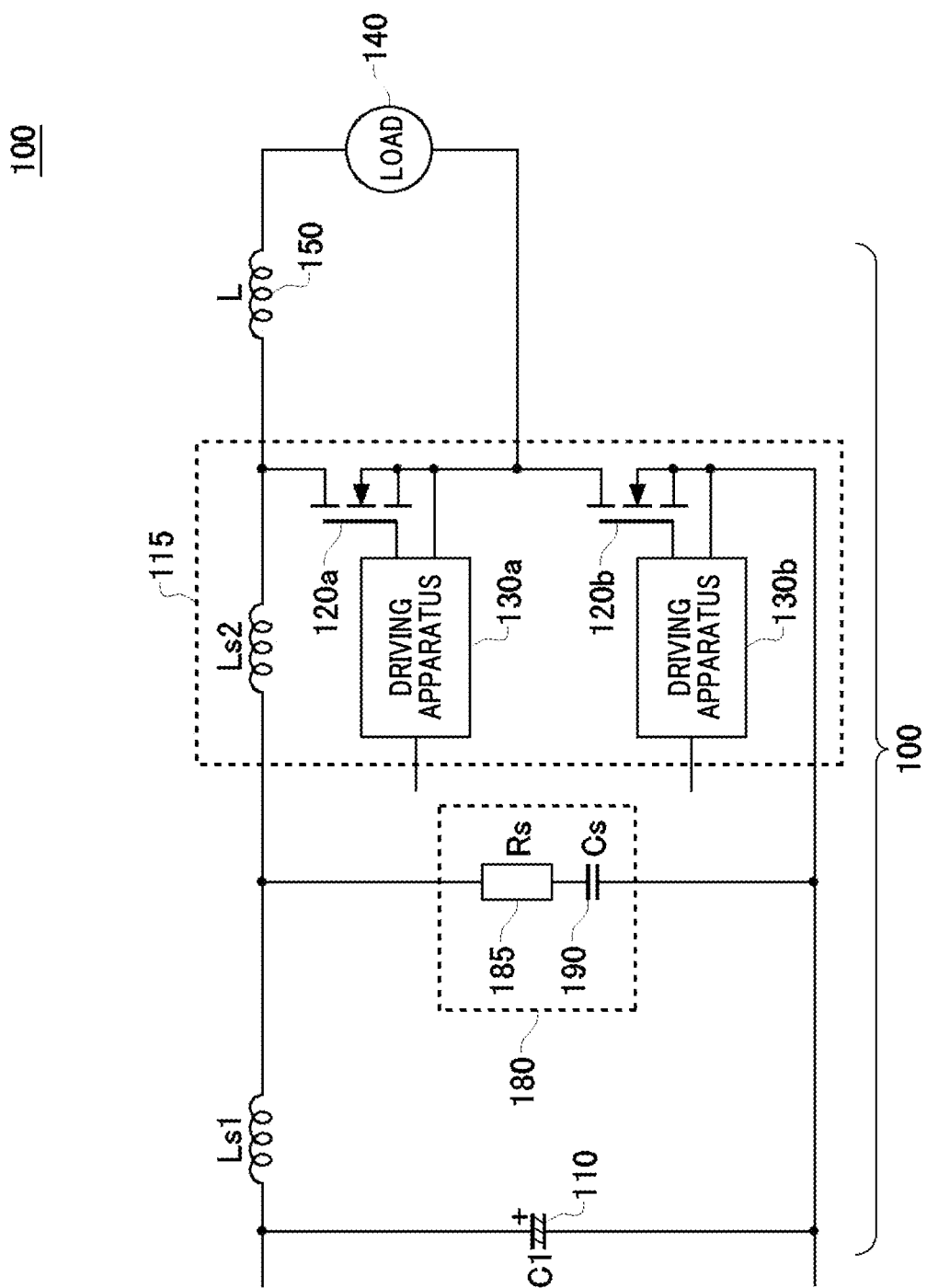
FIG. 1 illustrates a configuration of a power apparatus 100 according to the present embodiment together with a load 140.

FIG. 1 illustrates a configuration of a power apparatus 100 according to the present embodiment together with a load 140. The load 140 is a motor, an electric machine, or another power-consuming apparatus that operates by receiving power supply from the power apparatus 100. The power apparatus 100 includes an electrolytic capacitor 110, a semiconductor apparatus 115, an inductor 150, and a snubber 180.

The electrolytic capacitor 110 is connected between a positive bus bar and a negative bus bar of the power apparatus 100, and functions as a voltage source of the semiconductor apparatus 115 and the load 140. The electrolytic capacitor 110 accumulates a power supply voltage supplied from a power source (not illustrated) between the positive bus bar and the negative bus bar, and supplies the power supply voltage to the semiconductor apparatus 115.

The semiconductor apparatus 115 includes one or more semiconductor devices 120a and 120b (also referred to as "semiconductor device 120") and one or more driving apparatuses 130a and 130b (also referred to as "driving apparatus 130"). In the present embodiment, for the convenience of explanation, a case where the semiconductor apparatus 115 includes two semiconductor devices 120 and two driving apparatuses 130 will be described, but the semiconductor apparatus 115 may include one or three or more semiconductor devices 120 and driving apparatuses 130. The semiconductor apparatus 115 may be a semiconductor module in which one or more semiconductor devices 120 and one or more driving apparatuses 130 are integrated by resin sealing or the like.

Each semiconductor device 120 is a semiconductor switch device such as a MOSFET or an IGBT. Each semiconductor device 120 may be a SiC-MOSFET or a SiC-IGBT capable of switching at a higher speed. Each semiconductor device 120 includes a first main terminal, a second main terminal, and a control terminal that controls a connection state between the first main terminal and the second main terminal. In a case where the semiconductor device 120 is a MOSFET, the semiconductor device 120 includes a drain and a source as the first main terminal and the second main terminal, and includes a gate as the control terminal. In a case where the semiconductor device 120 is an IGBT, the semiconductor device 120 includes a collector and an emitter as the first main terminal and the second main terminal, and includes a gate as the control terminal. In the present embodiment, for the convenience of explanation, a case where the semiconductor device 120 is a MOSFET will be described. In the semiconductor devices 120a and 120b, the main terminals are connected in series between the positive bus bar and the negative bus bar in this order.

The driving apparatuses 130a and 130b are provided corresponding to the semiconductor devices 120a and 120b, respectively. Each driving apparatus 130 is connected to the control terminal of the corresponding semiconductor device 120, and drives the control terminal according to a control signal input from the outside. In this drawing, the driving apparatuses 130 are provided individually for the semiconductor devices 120, but the plurality of driving apparatuses 130 may be collectively referred to as a "driving apparatus".

The inductor 150 is connected in series with the load 140 between the positive bus bar and an intermediate terminal that is between the semiconductor device 120a and the semiconductor device 120b. The snubber 180 is connected between the positive bus bar and the negative bus bar outside the semiconductor apparatus 115. Accordingly, the snubber 180 is connected in parallel with the first main terminal and the second main terminal of each semiconductor device 120 between the positive bus bar and the negative bus bar. The snubber 180 suppresses vibrations in voltage and current due to switching of the semiconductor device 120. In the present embodiment, the snubber 180 is, for example, an RC snubber, and may include a resistor 185 and a capacitor 190 connected in series between the positive bus bar and the negative bus bar.

The operation of the power apparatus 100 in this drawing is as follows. First, in response to a control signal from the outside, the driving apparatuses 130a and 130b drive the semiconductor device 120a to be turned off and the semiconductor device 120b to be turned on. As a result, a current flows from the positive side of the electrolytic capacitor 110 to the negative side of the electrolytic capacitor 110 via the inductor 150, the load 140, and the semiconductor device 120b, power is supplied to the load 140, and energy is stored in the inductor 150.

Next, in response to a control signal from the outside, the driving apparatuses 130a and 130b drive the semiconductor device 120a to be turned on and the semiconductor device 120b to be turned off. The inductor 150 keeps flowing of a current by the stored energy, and performs a freewheeling operation in which the current output from the inductor 150 is returned to the inductor 150 via the load 140 and the semiconductor device 120a. When the power supplied to the load 140 is attenuated, the driving apparatuses 130a and 130b receive a control signal from the outside, and turn off the semiconductor device 120a and turn on the semiconductor device 120b.

Figure 2:
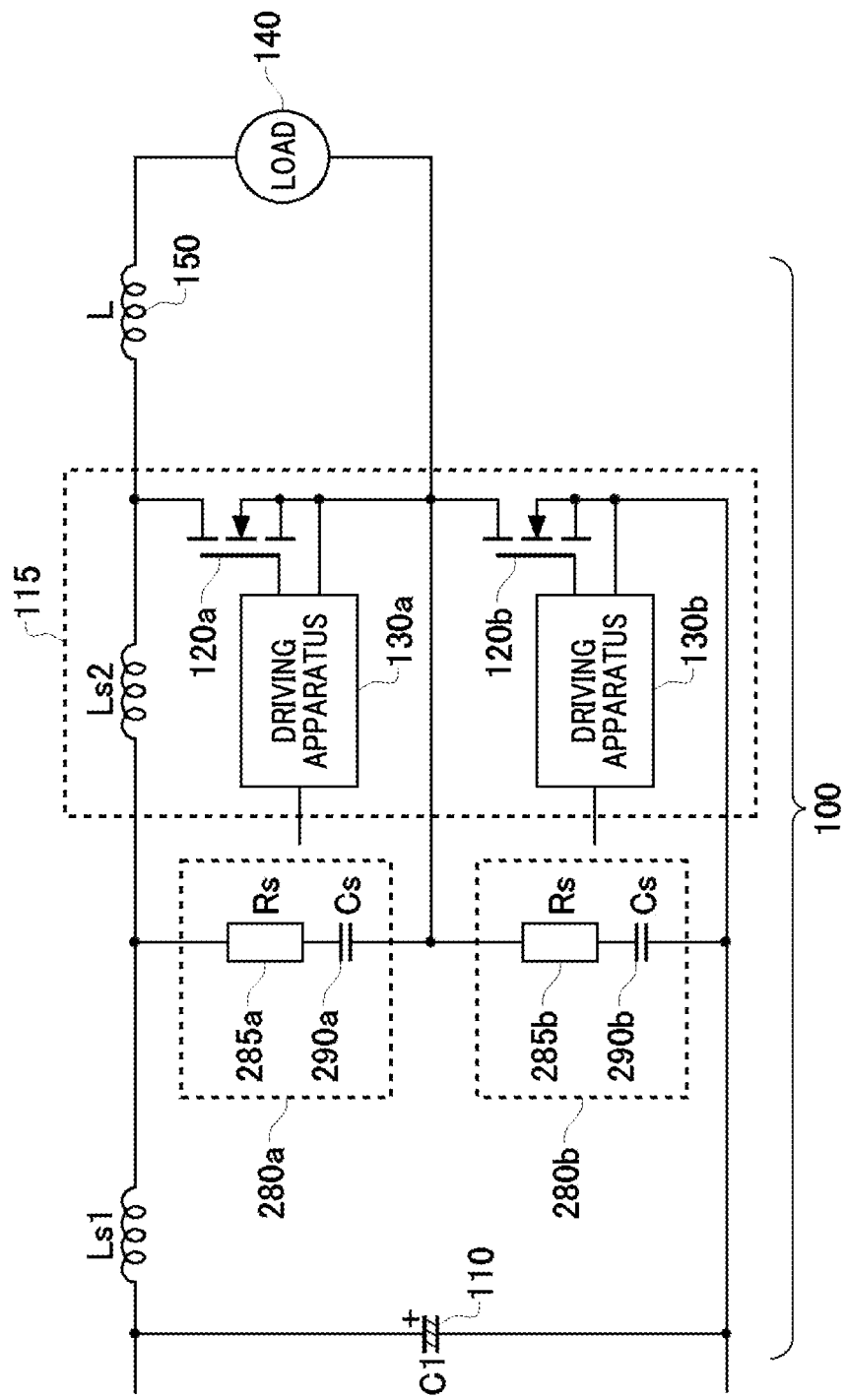
FIG. 2 illustrates a configuration of the power apparatus 100 according to a modification of the present embodiment together with the load 140.

FIG. 2 illustrates a configuration of a power apparatus 100 according to a modification of the present embodiment together with the load 140. The power apparatus 100 in FIG. 2 is the same as the power apparatus 100 in FIG. 1 except that a plurality of snubbers 280a and 280b (also referred to as "snubber 280") are provided instead of the snubber 180. Thus, members having the same or similar functions and configurations are denoted by the same reference numerals, and description thereof is omitted except for differences.

In the present modification, the snubbers 280 are provided corresponding to the semiconductor devices 120 and connected between main terminals of the corresponding semiconductor devices 120, respectively. Accordingly, each snubber 280 is connected in parallel to the first main terminal and the second main terminal of the corresponding semiconductor device 120. In the present modification, the snubber 280a is, for example, an RC snubber, and may include a resistor 285a and a capacitor 290a connected in series between main terminals of the corresponding semiconductor device 120. Likewise, the snubber 280b is also an RC snubber as an example, and may include a resistor 285b and a capacitor 290b connected in series between main terminals of the corresponding semiconductor device 120.

In FIG. 1 and FIG. 2, instead of the semiconductor device 120a, a rectifier diode having a cathode on the positive bus bar side and an anode on the intermediate terminal side may be used. The rectifier diode may be a SiC diode capable of switching at a high speed as an example.

Figure 3:
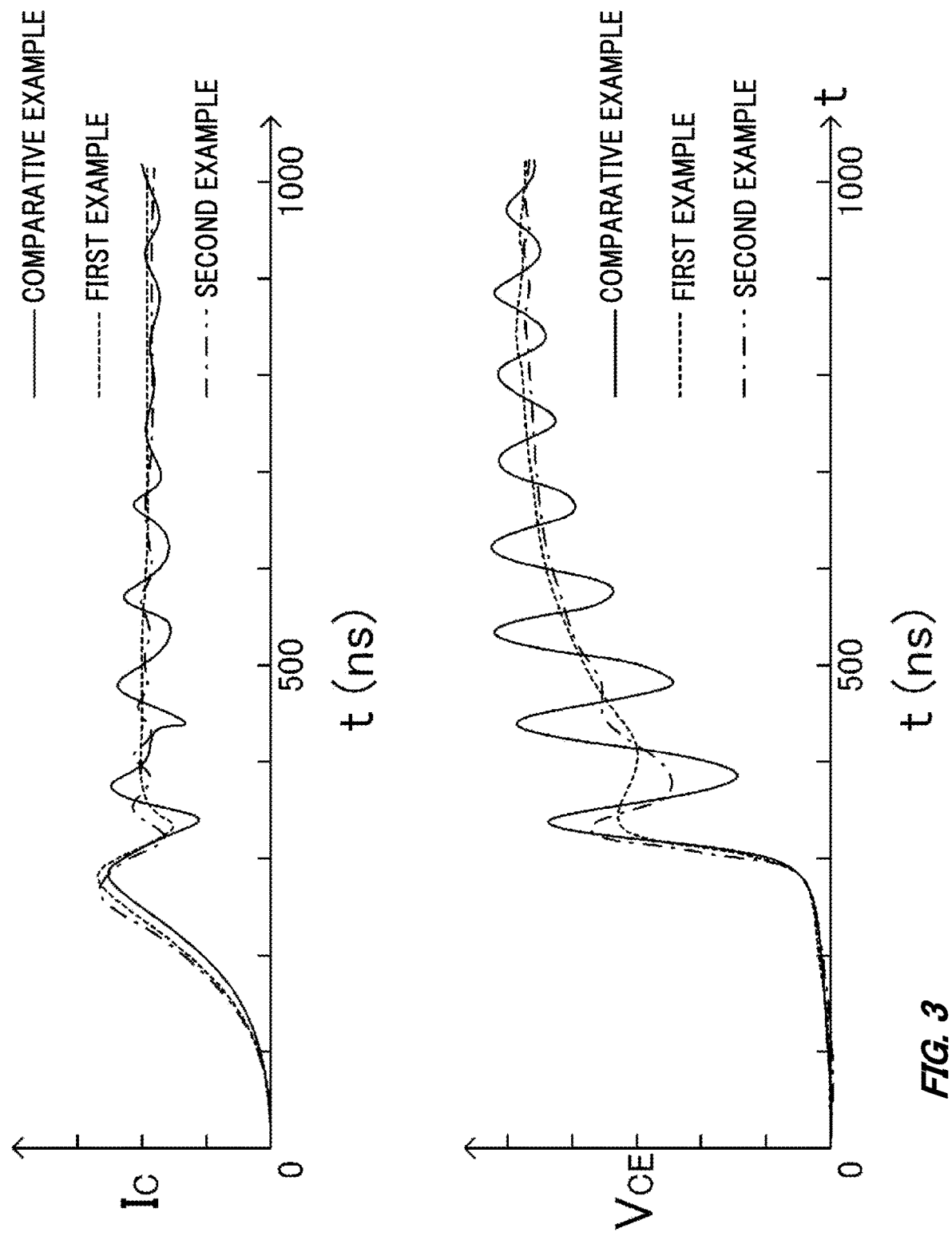
FIG. 3 illustrates an example of transient changes in current and voltage at the time of turn-on of a semiconductor device.

FIG. 3 illustrates an example of transient changes in current and voltage at the time of turn-on of the semiconductor device. This drawing is an excerpt of FIG. 5 of Patent Literature 1. "Comparative example", "first example", and "second example" in this drawing refer to the comparative example, the first example, and the second example in Patent Literature 1, but do not refer to the comparative example and examples in the specification of the present application.

The "comparative example" indicates a transient change in a collector current $I_C$ (that is, a current flowing between the main terminals) and a collector-emitter voltage $V_{CE}$ (that is, a voltage between the main terminals) in a case where the "semiconductor apparatus 100" of Patent Literature 1 does not include the "vibration suppression circuit 20". The "first example" indicates a transient change in the current $I_C$ and the voltage $V_{CE}$ in a case where the "semiconductor apparatus 100" of Patent Literature 1 includes the "vibration suppression circuit 20" having the same connection relationship as that of the snubber 180 in FIG. 1 of the present application. The "second example" indicates a transient change in the current $I_C$ and the voltage $V_{CE}$ in a case where the "semiconductor apparatus 110" of Patent Literature 1 includes a plurality of "vibration suppression circuits 20" having the same connection relationship as that of each snubber 280 in FIG. 2 of the present application (paragraph 0049 of Patent Literature 1).

Figure 5:
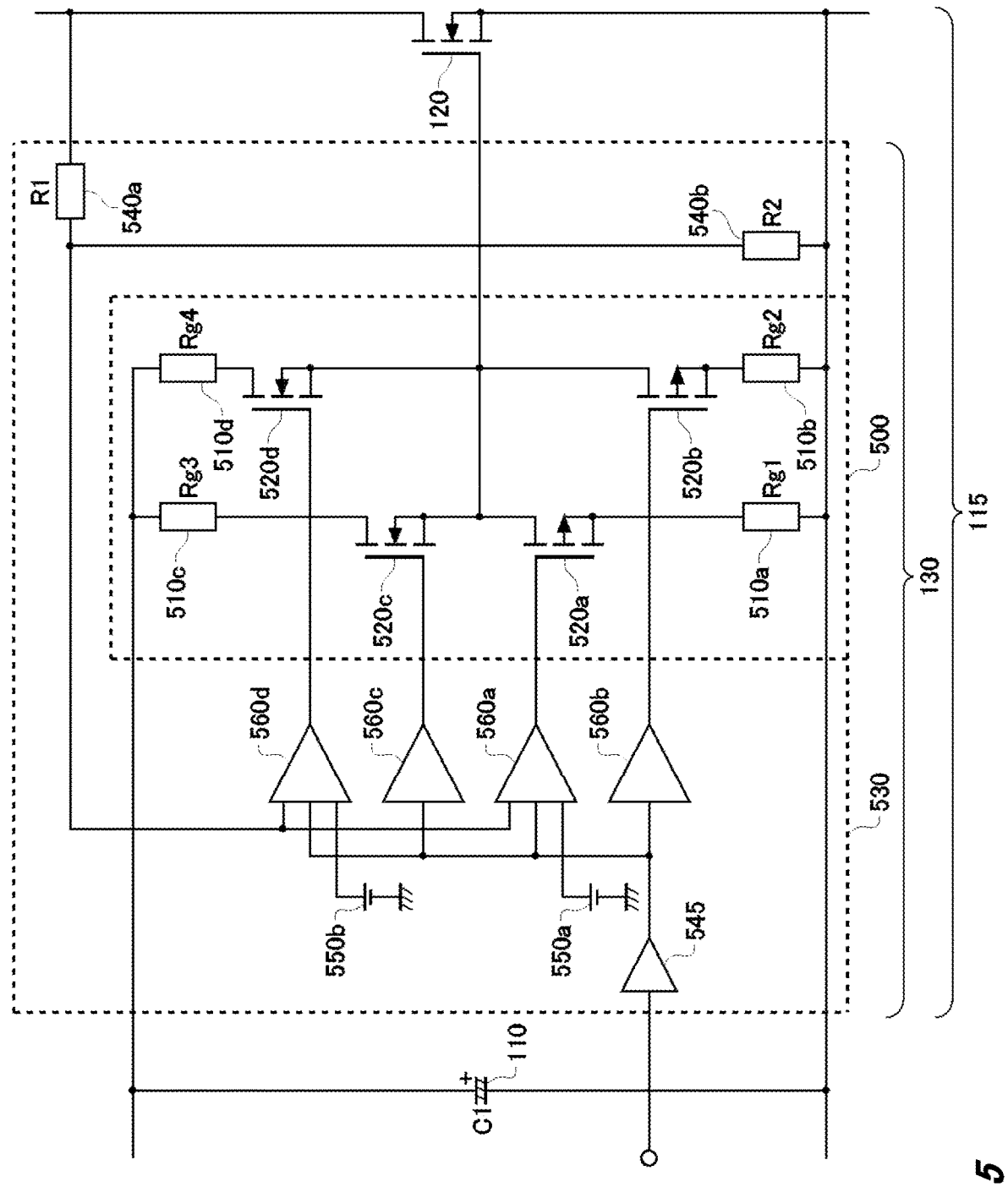
FIG. 5 illustrates a configuration of a semiconductor apparatus 115 according to the present embodiment.

As illustrated in this drawing, in the "comparative example" in which the "vibration suppression circuit 20" is not added to the "semiconductor apparatus 100", the current $I_C$ and the voltage $V_{CE}$ greatly vibrate at the time of turn-on of the "semiconductor device 14a". On the other hand, in the "first example" and the "second example" in which the "vibration suppression circuit 20" is added to the "semiconductor apparatus 100", the vibrations of the current $I_C$ and the voltage $V_{CE}$ are suppressed at the time of turn-on of the "semiconductor device 14a". The "vibration suppression circuit 20" of Patent Literature 1 suppresses the vibrations of the current $I_C$ and the voltage $V_{CE}$ likewise also at the time of turn-off of the "semiconductor device 14a". In FIG. 5 of Patent Literature 1, the voltage $V_{CE}$ indicates the voltage between the main terminals of the "semiconductor device 15a" on the opposite side in a case where the "semiconductor device 14a" is turned on (see paragraph 0049).

Figure 4:
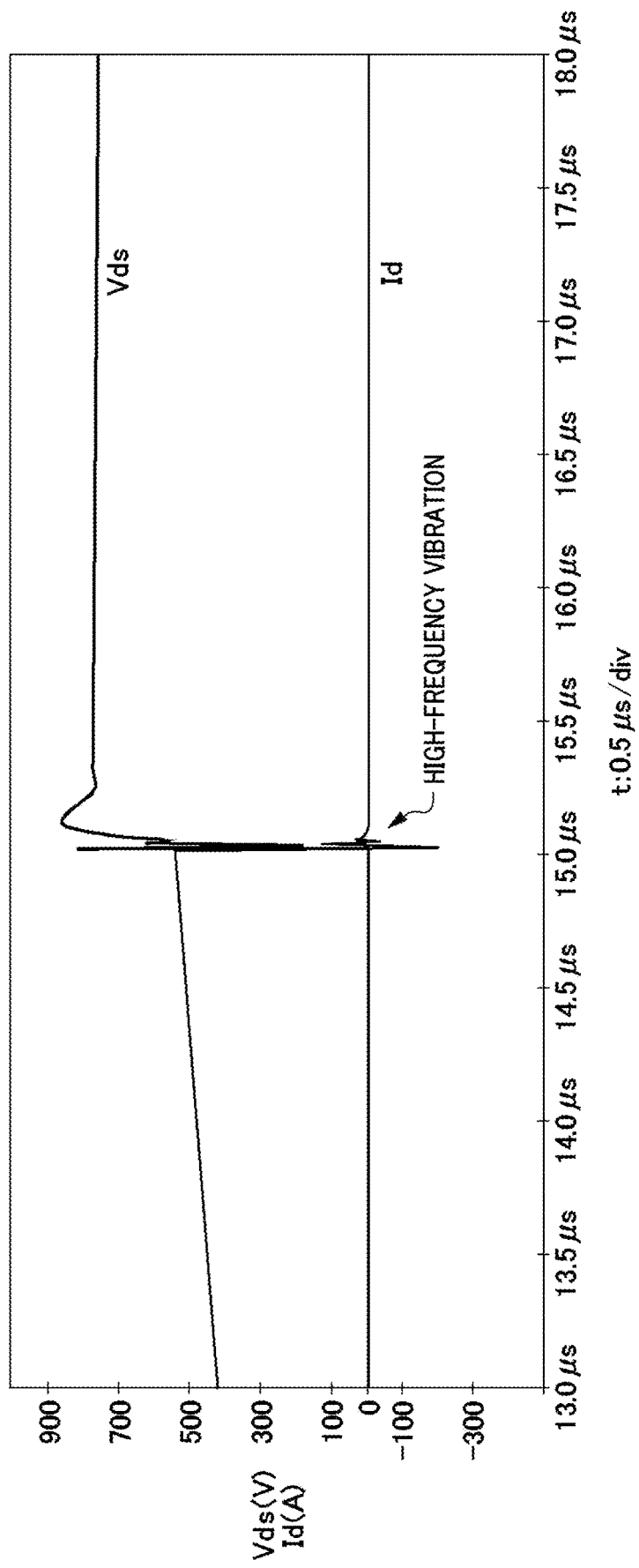
FIG. 4 illustrates an example of transient changes in current and voltage at the time of turn-off of the semiconductor device.

FIG. 4 illustrates an example of transient changes in current and voltage at the time of turn-off of the semiconductor device 120b. This drawing illustrates changes in the drain current Id and the drain-source voltage Vds in a case where a SiC-MOSFET is used as an example of the semiconductor device 120b in the power apparatus 100 of FIG. 1. In the example of this drawing, the semiconductor module of 1200 V/200 A is targeted, and a wiring inductance Ls1 between the electrolytic capacitor 110 and the snubber 180 in FIG. 1 is 20 nH, a wiring inductance Ls2 between the snubber 180 and the semiconductor devices 120a and 120b in the semiconductor apparatus 115 is 5 nH, a resistance Rs of the resistor 185 is 0.5Ω, a capacitance Cs of the capacitor 190 is 50 nF, and a resistance (gate resistance) between the driving apparatus 130b and the semiconductor device 120b is 0.1Ω and constant.

The wiring inductance Ls2 exists between the semiconductor devices 120a and 120b and the snubber 180. In addition, each semiconductor device 120 has a junction capacitance (denoted as "Cos") between the drain and the source. Therefore, the semiconductor apparatus 115 includes, on the side closer to the semiconductor apparatus 115 than to the snubber 180, an LC circuit in which the inductance Ls2 and the junction capacitance Cos are connected in series. Here, the wiring inductance Ls2 can be reduced by shortening the wiring by bringing the snubber 180 as close as possible to the semiconductor devices 120a and 120b. However, since the snubber 180 is provided outside the package of the semiconductor apparatus 115 and the semiconductor devices 120a and 120b have a certain size, there is a limit to suppressing the wiring inductance Ls2.

Such an LC circuit with the inductance Ls2 and the junction capacitance Cos causes local fluctuations in the current Id and the voltage Vds that cannot be sufficiently suppressed by the snubber 180 or the snubber 280 farther away from the semiconductor devices 120a and 120b. In this drawing, the semiconductor device 120b is turned off at the time of 15.0 μs on the horizontal axis, but large variations in current and voltage at a relatively high frequency occur for a short period of time at this timing as compared with the vibrations in current and voltage in FIG. 3.

Here, in order to suppress the local vibration as illustrated in FIG. 3 caused by the LC circuit due to the inductance Ls2 and the junction capacitance Cos, it is considered to provide a damping resistor Rd in series with the LC circuit. A damping coefficient ζ in a case where such a damping resistor Rd is provided is expressed by the following Expression (1).

$$\zeta = Rd/2 \cdot \sqrt{(Cos/Ls2)} \qquad (1)$$

As the damping coefficient ζ is larger, the vibration by the LC circuit can be greatly attenuated. From this viewpoint, the damping coefficient ζ may be 0.8 to 1.0 or more. Also in a case where the snubber 180 or the snubber 280 is provided outside the semiconductor apparatus 115, the snubber 180 or the snubber 280 is disposed as close as possible to the semiconductor apparatus 115 in the power apparatus 100. Therefore, the inductance Ls1 can be several times to several tens of times or more the inductance Ls2. As it is clear from Expression (1), the damping coefficient ζ is proportional to −½ power of the inductance. Therefore, in order to suppress the resonance of the LC circuit due to the inductance Ls1+Ls2 and the junction capacitance Cos by the damping resistor Rd without providing the snubber 180 or the snubber 280, it is necessary to set the damping resistor Rd to several times to several tens of times or more in order to realize the damping coefficient ζ of the same magnitude. For example, in a case where Ls1+Ls2 is 16 times Ls2, the damping resistor Rd has to be 4 times in order to realize the same damping coefficient ζ.

Here, a switching loss Psw, which is energy (or power) lost during switching of the semiconductor device 120b, is a product of a current (for example, drain current) Id flowing between the main terminals of the semiconductor device 120b during switching, an inter-main-terminal voltage (for example, drain-source voltage) Vds of the semiconductor device 120b, and a switching time Tsw. Here, assuming that the switching loss Psw is generated by the damping resistor Rd, Psw=Vd×Id=Rd×Id$^2$×Tsw. Therefore, the damping resistor Rd is expressed by the following Expression (2).

$$Rd=Psw/(Id^2)/Tsw \qquad (2)$$

From Expression (2), it can be seen that the switching loss Psw of the semiconductor device 120b increases when the damping resistor Rd is increased. Therefore, in a case where the resonance of the LC circuit is suppressed by the damping resistor Rd without providing the snubber 180 and the snubber 280, the switching loss Psw increases as the damping resistor Rd increases.

Therefore, the power apparatus 100 suppresses the vibration as illustrated in FIG. 3 using the snubbers such as the snubber 180 of FIG. 1 and the snubber 280 of FIG. 2, and also causes the semiconductor device 120 to generate the switching loss Psw that generates the damping resistor Rd for realizing the damping coefficient ζ to some extent so as to attenuate the local vibration generated by the LC circuit due to the inductance Ls2 and the junction capacitance Cos.

FIG. 5 illustrates a configuration of a semiconductor apparatus 115 according to the present embodiment together with the electrolytic capacitor 110. The semiconductor apparatus 115 suppresses local vibrations caused by the LC circuit due to the inductance Ls2 and the junction capacitance Cos in the power apparatus 100 to which a snubber such as the snubber 180 of FIG. 1 or the snubber 280 of FIG. 2 is added as an example.

In this drawing, the members denoted by the same reference numerals as those in FIG. 1 or FIG. 2 have the same functions and configurations as those of the corresponding members in FIG. 1 or FIG. 2, and thus the description thereof will be omitted except for the differences. As illustrated in FIG. 1 and FIG. 2, the semiconductor apparatus 115 includes one or more semiconductor devices 120 and one or more driving apparatuses 130. In this drawing, the description will be given focusing on one semiconductor device 120 (for example, the semiconductor device 120b) and one driving apparatus 130 (for example, the driving apparatus 130b).

The driving apparatus 130 includes a driving section 500 and a drive control section 530. The driving section 500 receives control according to a control signal input from the outside from the drive control section 530, and drives the control terminal of the semiconductor device 120 according to the control signal. The driving section 500 includes a driving circuit in which a resistor 510a and a driving switch 520a are connected in series, and a driving circuit (a driving circuit on the negative side) in which a resistor 510b and a driving switch 520b are connected in series, between the negative bus bar serving as a negative reference potential and the control terminal of the semiconductor device 120. In addition, the driving section 500 includes a driving circuit in which a resistor 510c and a driving switch 520c are connected in series, and a driving circuit (a driving circuit on the positive side) in which a resistor 510d and a driving switch 520d are connected in series, between the positive bus bar serving as a positive reference potential and the control terminal of the semiconductor device 120. In the example of this drawing, the driving switches 520a and 520b are p-channel MOSFETs, and the driving switches 520c and 520d are n-channel MOSFETs. Alternatively, each of the driving switches 520a to 520d (also referred to as "driving switch 520") may be any switching device capable of connecting or disconnecting between the control terminal of the semiconductor device 120 and the positive bus bar or the negative bus bar via each of the resistors 510a to 510d (also referred to as "resistor 510").

The drive control section 530 controls the driving section 500 according to a control signal input from the outside. Here, during a period in which an inter-main-terminal voltage between the first main terminal and the second main terminal of the semiconductor device 120 changes by a predetermined reference voltage difference when the semiconductor device 120 is switching, the drive control section 530 performs control to lower the drive capability of the driving section 500 as compared with at least some other periods. In the present embodiment, the drive control section 530 switches the driving switch 510 of each of the plurality of driving circuits to change the drive capability of the driving section 500.

The drive control section 530 includes a plurality of voltage dividing resistors 540a and 540b, a buffer 545, voltage sources 550a and 550b (also referred to as "voltage source 550"), and a plurality of drivers 560a to 560d (also referred to as "driver 560"). The voltage dividing resistors 540a and 540b are connected in series between the first main terminal and the second main terminal of the semiconductor device 120, and divide the inter-main-terminal voltage of the semiconductor device 120 by a resistance ratio of a resistance value R1 of the voltage dividing resistor 540a and a resistance value R2 of the voltage dividing resistor 540b, thereby outputting a detection signal proportional to the inter-main-terminal voltage. Here, if the inter-main-terminal voltage of the semiconductor device 120 (the drain-source voltage in this drawing) is Vds, the detection signal is R2/(R1+R2)·Vds.

The buffer 545 buffers and outputs a control signal input from the outside. The buffer 545 may amplify and output the control signal in order to drive the drivers 560a to 560d. In the present embodiment, the control signal instructs to turn off the semiconductor device 120 in the case of a low level and to turn on the semiconductor device 120 in the case of a high level. The voltage source 550a outputs a threshold voltage Vth1 to be compared with the detection value of the inter-main-terminal voltage. The voltage source 550b outputs a threshold voltage Vth2 to be compared with the detection value of the inter-main-terminal voltage.

The driver 560a is connected to the buffer 545 and the voltage source 550a between the voltage dividing resistors 540a and 540b. The driver 560a is a driver with a comparator, and turns on the driving switch 520a with the control terminal of the driving switch 520a at a low level on condition that the detection signal of the inter-main-terminal voltage is equal to or higher than the threshold voltage Vth1 in a case where the control signal input via the buffer 545 is at a low level. In a case where the control signal is at a high level or in a case where the detection signal of the inter-main-terminal voltage is less than the threshold voltage Vth1, the driver 560a sets the control terminal of the driving switch 520a to a high level and turns off the driving switch 520a. Here, since the detection signal is a resistance divided voltage of the inter-main-terminal voltage of the semiconductor device 120, the driver 560a substantially compares the inter-main-terminal voltage with a first threshold Th1 that is (R1+R2)/R2 times the threshold voltage Vth1.

The driver 560b is connected between the voltage dividing resistors 540a and 540b and to the buffer 545. In a case where the control signal is at a low level, the driver 560b sets the control terminal of the driving switch 520b to a low level and turns on the driving switch 520b. In a case where the control signal is at a high level, the driver 560b sets the control terminal of the driving switch 520b to a high level and turns off the driving switch 520b.

As a result, in a period in which the semiconductor device 120 is turned off in response to switching of the control terminal from the high level to the low level, the drivers 560a and 560b turn off the driving switch 520a and turn on the driving switch 520b while the inter-main-terminal voltage is less than the first threshold Th1 starting from a state in which the inter-main-terminal voltage is substantially 0, and drive the control terminal at a first drive capability by the driving section 500. If the inter-main-terminal voltage becomes equal to or higher than the first threshold Th1, the drivers 560a and 560b turn on the driving switches 520a and 520b to drive the control terminal at a second drive capability.

Here, in a case where the driving switch 520a is turned off and the driving switch 520b is turned on, the magnitude of the gate resistance becomes a resistance value Rg2 of the resistor 510b, whereas in a case where the driving switches 520a and 520b are turned on, the magnitude of the gate resistance becomes a combined resistance value Rg1·Rg2/(Rg1+Rg2) by the parallel connection of the resistance values Rg1 and Rg2 of the resistors 510a and 510b, and becomes smaller than the resistance value Rg2. Therefore, the second drive capability in a case where the driving switches 520a and 520b are turned on is higher than the first drive capability in a case where the driving switch 520a is turned off and the driving switch 520b is turned on.

The driver 560c is connected between the voltage dividing resistors 540a and 540b and to the buffer 545. In a case where the control signal is at a high level, the driver 560c sets the control terminal of the driving switch 520c to a high level and turns on the driving switch 520c. In a case where the control signal is at a low level, the driver 560c sets the control terminal of the driving switch 520c to a low level and turns off the driving switch 520c.

The driver 560d is connected to the buffer 545 and the voltage source 550b between the voltage dividing resistors 540a and 540b. The driver 560d is a driver with a comparator, and turns on the driving switch 520d with the control terminal of the driving switch 520d at a high level on condition that the detection signal of the inter-main-terminal voltage is equal to or higher than the threshold voltage Vth2 in a case where the control signal input via the buffer 545 is at a high level. In a case where the control signal is at a low level or in a case where the detection signal of the inter-main-terminal voltage is less than the threshold voltage Vth2, the driver 560d sets the control terminal of the driving switch 520d to a low level and turns off the driving switch 520d. Here, since the detection signal is a resistance divided voltage of the inter-main-terminal voltage of the semiconductor device 120, the driver 560d substantially compares the inter-main-terminal voltage with a second threshold Th2 that is (R1+R2)/R2 times the threshold voltage Vth2.

As a result, in the period in which the semiconductor device 120 is turned on in response to the switching of the control terminal from the low level to the high level, the drivers 560c and 560d turn on the driving switches 520c and 520d while the inter-main-terminal voltage is equal to or higher than the second threshold Th2, and drive the control terminal at a third drive capability by the driving section 500. When the inter-main-terminal voltage becomes less than the second threshold Th2, the drivers 560c and 560d turn on the driving switch 520c and turn off the driving switch 520d to drive the control terminal at a fourth drive capability by the driving section 500. Here, since the gate resistance in a case where the driving switch 520c is turned on and the driving switch 520d is turned off is larger than the gate resistance in a case where the driving switches 520c and 520d are turned on, the fourth drive capability is lower than the third drive capability.

In this manner, the drive control section 530 can change the drive capability of the control terminal by changing the magnitude of the control resistance (gate resistance) connected between the control terminal and the reference potential, that is, the magnitude of the combined resistance. In place of the configuration illustrated in this drawing, the driving section 500 may have a control resistor by a variable resistor, and the drive control section 530 may change the drive capability of the control terminal by changing the resistance value of the variable resistor of the driving section 500.

In addition, the driving section 500 may adopt a configuration including a plurality of driving circuits in which a capacitor and the driving switch 510 are each connected in series between the reference potential and the control terminal. In this case, the drive control section 530 changes the drive capability of the control terminal by changing the capacitance of the capacitor connected between the control terminal and the first main terminal or the second main terminal.

Here, in a case where the same gate current is applied, as the combined capacitance of the capacitor connected between the control terminal and the main terminal of the semiconductor device 120 increases, the change in the gate voltage is suppressed, and the drive capability of the driving section 500 decreases. Therefore, in a case where a capacitor is used instead of the resistor 510a, the driver 560a turns on the driving switch 520a with the control terminal of the driving switch 520a at a low level on condition that the detection signal of the inter-main-terminal voltage is less than the threshold voltage Vth1 in a case where the control signal input via the buffer 545 is at a low level. In a case where a capacitor is used instead of the resistor 510d, the driver 560d turns on the driving switch 520d with the control terminal of the driving switch 520d at a high level on condition that the detection signal of the inter-main-terminal voltage is less than the threshold voltage Vth2 in a case where the control signal input via the buffer 545 is at a high level.

Figure 6:
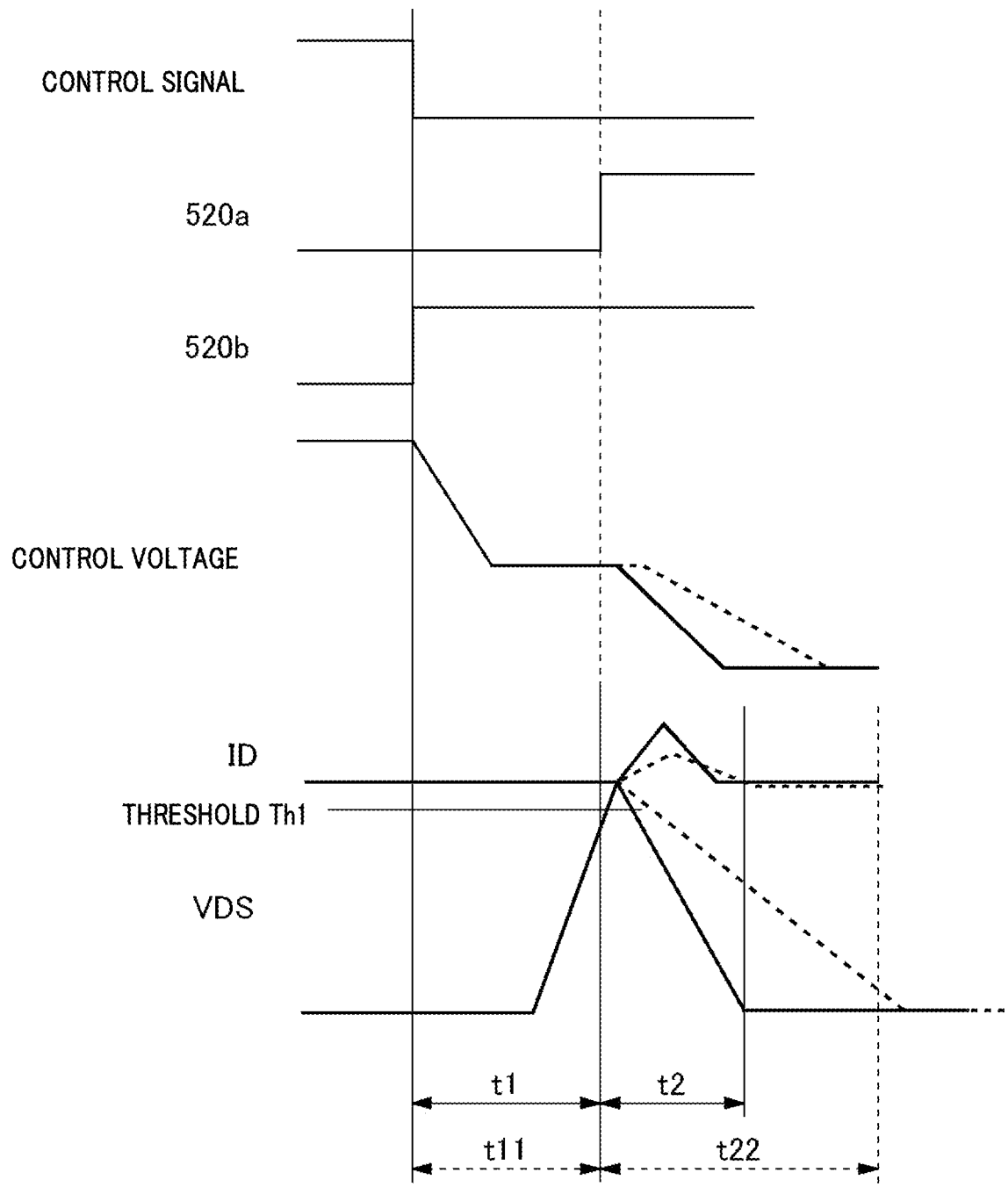
FIG. 6 illustrates an operation waveform at the time of turn-off of the semiconductor device.

FIG. 6 illustrates an operation waveform when the semiconductor device 120 is turned off. Specifically, this drawing illustrates changes over time indicated in the horizontal axis direction of each of the control signal, the connection state of the driving switch 520a, the connection state of the driving switch 520b, the control voltage (gate voltage) of the semiconductor device 120, the inter-main-terminal voltage VDS, and a current (drain current) ID flowing through the semiconductor device 120.

In a steady state in which the semiconductor device 120 is turned on, the control signal is at a high level, the driving switches 520a and 520b are turned off, and the driving switches 520c and 520d are turned on. In this state, the inter-main-terminal voltage VDS of the semiconductor device 120 is substantially 0 V, and the current ID required by the load 140 flows through the semiconductor device 120.

If the control signal changes from the high level to the low level, the driving apparatus 130 starts a turn-off operation of the semiconductor device 120. The driver 560a turns off the driving switch 520a during a period t1 in which the inter-main-terminal voltage VDS is less than the first threshold Th1. The driver 560b turns on the driving switch 520b when the control signal changes to the low level. The drivers 560c and 560d turn off the driving switches 520c and 520d. As a result, the drive control section 530 drives the control terminal of the semiconductor device 120 at the first drive capability to lower the control voltage of the control terminal.

If the control voltage drops to some extent, the semiconductor device 120 starts turning off. Accordingly, the inter-main-terminal voltage VDS increases, and after the period t1 elapses after the control signal changes to the low level, the voltage VDS becomes equal to or higher than the first threshold Th1. The driver 560a turns on the driving switch 520a in response to the inter-main-terminal voltage VDS becoming equal to or higher than the first threshold Th1. The semiconductor device 120 decreases the current ID as indicated by the solid line in the drawing in response to the start of turning-off, and sets the current ID to 0 to be in the OFF state after a period t1+t2 after the control signal changes to the low level.

According to the driving apparatus 130 of the present embodiment, in the turn-off operation of the semiconductor device 120, the drive capability of the driving section 500 is lowered during a period in which the inter-main-terminal voltage VDS changes from substantially 0 to the first threshold Th1 (that is, during a period in which the inter-main-terminal voltage VDS changes substantially by the voltage difference of the first threshold Th1) as compared with the period after the inter-main-terminal voltage VDS becomes equal to or higher than the first threshold. Here, if the driving apparatus 130 does not have a driving circuit including the resistor 510a and the driving switch 520a, and the control terminal of the semiconductor device 120 is driven only by the driving switch 520b even after the inter-main-terminal voltage VDS becomes equal to or higher than the first threshold Th1, the decrease in the current ID is delayed as indicated by a broken line in the drawing. In this case, as compared with a case where the control terminal of the semiconductor device 120 is driven using both the driving switch 520a and the driving switch 520b in a case where the inter-main-terminal voltage VDS becomes equal to or higher than the first threshold Th1, the turn-off period becomes longer as indicated by t11+t22 in the drawing, and the switching loss increases.

On the other hand, according to the driving apparatus 130 of the present embodiment, while the drive capability of the driving section 500 is lowered during the period t1 in which the inter-main-terminal voltage VDS changes by the reference voltage difference, the drive capability of the driving section 500 is increased during the period t2 in which the inter-main-terminal voltage VDS does not relatively change. Here, as the change rate of the inter-main-terminal voltage VDS increases, the vibration accompanying the turn-off of the semiconductor device 120 increases. However, the driving apparatus 130 lowers the drive capability of the driving section 500 in the period t1 in which the inter-main-terminal voltage VDS changes largely to suppress the change rate of the voltage VDS, thereby efficiently suppressing the generation of vibration.

Figure 7:
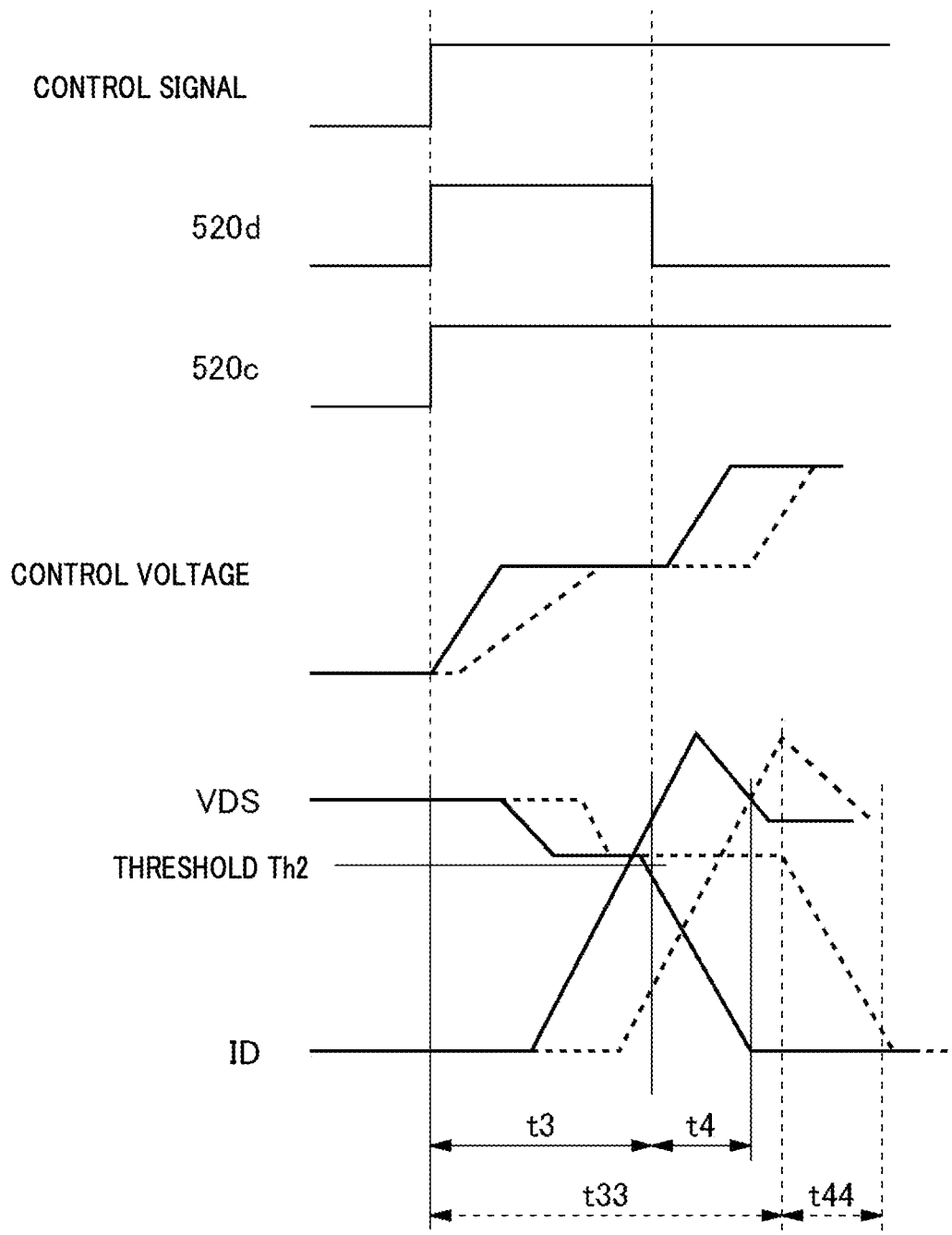
FIG. 7 illustrates an operation waveform at the time of turn-on of the semiconductor device.

FIG. 7 illustrates an operation waveform at the time of turn-on of the semiconductor device 120. Specifically, this drawing illustrates changes over time in the horizontal axis direction of each of the control signal, the connection state of the driving switch 520d, the connection state of the driving switch 520c, the control voltage (gate voltage) of the semiconductor device 120, the inter-main-terminal voltage VDS, and a current (drain current) ID flowing through the semiconductor device 120.

In a steady state in which the semiconductor device 120 is turned off, the control signal is at a low level, the driving switches 520a and 520b are turned on, and the driving switches 520c and 520d are turned off. In this state, the inter-main-terminal voltage VDS of the semiconductor device 120 is substantially a power source voltage generated by the electrolytic capacitor 110, and no current flows through the semiconductor device 120.

If the control signal changes from the low level to the high level, the driving apparatus 130 starts a turn-on operation of the semiconductor device 120. The drivers 560c and 560d turn on the driving switches 520c and 520d while the inter-main-terminal voltage VDS is equal to or higher than the second threshold Th2. The drivers 560a and 560b turn off the driving switches 520a and 520b. As a result, the drive control section 530 drives the control terminal of the semiconductor device 120 at the third drive capability to increase the control voltage of the control terminal.

If the control voltage increases to some extent, the semiconductor device 120 starts turning on. Accordingly, the inter-main-terminal voltage VDS drops, and after the period t3 elapses after the control signal changes to the high level, the voltage VDS becomes less than the second threshold Th2. The driver 560d turns off the driving switch 520d in response to the inter-main-terminal voltage VDS becoming less than the second threshold Th2. The semiconductor device 120 drops the inter-main-terminal voltage VDS as indicated by the solid line in the drawing in response to the start of turning-on, and sets the inter-main-terminal voltage VDS to substantially 0 after a period t3+t4 after the control signal changes to the high level. In addition, the semiconductor device 120 increases the current ID as indicated by the solid line in the drawing in response to the start of turning-on, and sets the current ID as a steady current near the time point when the period t3+t4 elapses after the control signal changes to the high level.

According to the driving apparatus 130 of the present embodiment, in the turn-on operation of the semiconductor device 120, the drive capability of the driving section 500 is lowered during a period in which the inter-main-terminal voltage VDS changes from the second threshold Th2 to substantially 0 (that is, during a period in which the inter-main-terminal voltage VDS changes substantially by the voltage difference of the second threshold Th2) as compared with the period after the inter-main-terminal voltage VDS becomes equal to or higher than the second threshold. Here, if the driving apparatus 130 does not have a driving circuit including the resistor 510d and the driving switch 520d, and the control terminal of the semiconductor device 120 is driven only by the driving switches 520b and 520c even while the inter-main-terminal voltage VDS becomes equal to or higher than the second threshold Th2, the decrease in the inter-main-terminal voltage VDS and the increase in the current ID are delayed as indicated by a broken line in the drawing. In this case, as compared with a case where the control terminal of the semiconductor device 120 is driven using both the driving switch 520c and the driving switch 520d while the inter-main-terminal voltage VDS is equal to or higher than the second threshold Th2, the turn-on period becomes longer as indicated by t33+t44 in the drawing, and the switching loss increases.

On the other hand, according to the driving apparatus 130 of the present embodiment, while the drive capability of the driving section 500 is lowered during the period t4 in which the inter-main-terminal voltage VDS changes by the reference voltage difference, the drive capability of the driving section 500 is increased during the period t3 in which the inter-main-terminal voltage VDS does not relatively change. Here, as the change rate of the inter-main-terminal voltage VDS increases, the vibration accompanying the turn-off of the semiconductor device 120 increases. However, the driving apparatus 130 lowers the drive capability of the driving section 500 in the period t4 in which the inter-main-terminal voltage VDS changes largely to suppress the change rate of the voltage VDS, and suppresses the reduction rate of the resistance value of the semiconductor device 120 to increase the damping resistor Rd, thereby efficiently suppressing the generation of vibration.

At least one of the first threshold Th1 to be compared with the inter-main-terminal voltage VDS during the turn-off period and the second threshold Th2 to be compared with the inter-main-terminal voltage VDS during the turn-on period may be 60% or more and less than 100%, or 80% or more and less than 95% of the inter-main-terminal voltage in the steady state in which the semiconductor device 120 is turned off. In addition, the first threshold Th1 and the second threshold Th2 may be the same value or different values.

Figure 8:
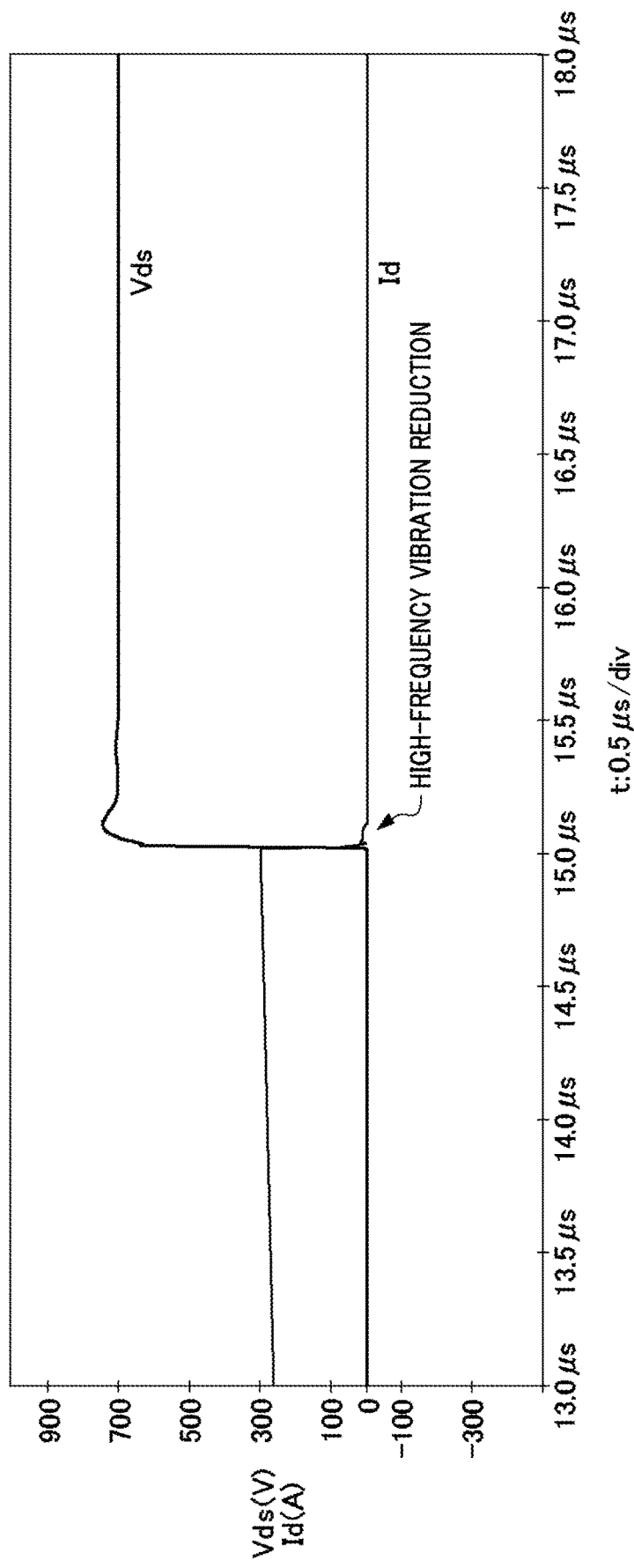
FIG. 8 illustrates an example of transient changes in current and voltage at the time of turn-off of the semiconductor device.

FIG. 8 illustrates an example of transient changes in current and voltage at the time of turn-off of when the semiconductor device. In this drawing, the same conditions as those in FIG. 4 are applied except that the resistance (gate resistance) between the driving apparatus 130b and the semiconductor device 120b is increased from 0.1Ω to 2Ω during the period in which the inter-main-terminal voltage changes by the reference voltage difference.

In FIG. 4, local high-frequency vibrations of the current Id and the voltage Ids by the LC circuit due to the inductance Ls2 and the junction capacitance Cos are observed at the timing when the semiconductor device 120b is turned off at 15.0 μs on the horizontal axis. On the other hand, in this drawing, such high-frequency vibration can be suppressed. The driving apparatus 130 only needs to increase the gate resistance during the period in which the inter-main-terminal voltage changes by the reference voltage difference, and may increase the gate resistance twice or more, for example.

How much the drive capability of the driving apparatus 130 is lowered during the period in which the inter-main-terminal voltage changes by the reference voltage difference, that is, for example, how much the gate resistance is increased may vary depending on the magnitude of the wiring inductance Ls2 or the like. Therefore, the manufacturer of the semiconductor apparatus 115 or the user of the semiconductor apparatus 115 may determine the drive capability of the driving apparatus 130 using the simulation result of the semiconductor apparatus 115 or the test result of the semiconductor apparatus 115. In addition, the driving apparatus 130 may include a setting memory or the like in which the drive capability of the driving apparatus 130 during a period in which the inter-main-terminal voltage changes by the reference voltage difference can be set from the outside, or the drive capability of the driving apparatus 130 may be switched according to the setting value.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that a mode to which such a change or improvement is added can also be included in the technical scope of the present invention.

It should be noted that the order of execution of each processing such as operations, procedures, steps, and stages in the apparatuses, systems, programs, and methods illustrated in the claims, the specification, and the drawings can be realized in any order unless "before", "prior to", or the like is specifically stated, and unless the output of the previous processing is used in the later processing. Even if the operation flow in the claims, the specification, and the drawings is described using "first", "next", and the like for convenience, it does not mean that it is essential to perform in this order.

EXPLANATION OF REFERENCES

100: power apparatus;
110: electrolytic capacitor;
115: semiconductor apparatus;
120a, 120b: semiconductor device;
130a, 130b: driving apparatus;
140: load;
150: inductor;
180: snubber;
185: resistor;
190: capacitor;
280a, 280b: snubber;
285a, 285b: resistor;
290a, 290b: capacitor;
500: driving section;
510a, 510b, 510c, 510d: resistor;
520a, 520b, 520c, 520d: driving switch;
530: drive control section;
540a, 540b: voltage dividing resistor;
545: buffer;
550a, 550b: voltage source;
560a, 560b, 560c, 560d: driver

What is claimed is:

1. A driving apparatus comprising:
  a driving section configured to drive a control terminal of a semiconductor device according to a control signal input from an outside, the semiconductor device including a first main terminal, a second main terminal, and the control terminal that is configured to control a connection state between the first main terminal and the second main terminal that are connected in parallel with a snubber; and
  a drive control section configured to lower a drive capability of the driving section during a period in which an inter-main-terminal voltage between the first main terminal and the second main terminal changes by a predetermined reference voltage difference owing to switching of the semiconductor device, compared with other at least some periods,
  wherein in a period in which the semiconductor device is turned off, the drive control section drives the control terminal at a first drive capability by the driving section while the inter-main-terminal voltage is less than a first threshold, and drives the control terminal at a second drive capability higher than the first drive capability by the driving section when the inter-main-terminal voltage becomes equal to or higher than the first threshold, and wherein in a period in which the semiconductor device is turned on, the drive control section drives the control terminal at a third drive capability by the driving section while the inter-main-terminal voltage is equal to or higher than a second threshold, and drives the control terminal at a fourth drive capability lower than the third drive capability by the driving section when the inter-main-terminal voltage becomes less than the second threshold.

2. The driving apparatus according to claim 1, wherein the first threshold and the second threshold are 60% or more and less than 100% of the inter-main-terminal voltage in a steady state in which the semiconductor device is turned off.

3. The driving apparatus according to claim 2, wherein the first threshold and the second threshold are 80% or more and less than 95% of the inter-main-terminal voltage in a steady state in which the semiconductor device is turned off.

4. The driving apparatus according to claim 2, wherein the first threshold and the second threshold are the same values.

5. The driving apparatus according to claim 1, wherein the first threshold and the second threshold are 80% or more and less than 95% of the inter-main-terminal voltage in a steady state in which the semiconductor device is turned off.

6. The driving apparatus according to claim 5, wherein the first threshold and the second threshold are the same values.

7. The driving apparatus according to claim 1, wherein the first threshold and the second threshold are the same values.

8. The driving apparatus according to claim 1, wherein the drive control section changes a drive capability of the control terminal by changing at least one of a magnitude of a resistance of a resistor connected between the control terminal and a reference potential or a capacitance of a capacitor connected between the control terminal and the first main terminal or the second main terminal.

9. The driving apparatus according to claim 1, wherein the driving section includes a plurality of driving circuits in which a resistor or a capacitor, and a driving switch are each connected in series between a reference potential and the control terminal, and the drive control section changes a drive capability of the driving section by switching the driving switch of each of the plurality of driving circuits.

10. The driving apparatus according to claim 1, wherein the semiconductor device is a SiC-MOSFET or a SiC-IGBT.

11. A semiconductor apparatus comprising:
the semiconductor device; and
the driving apparatus according to claim 1 that is configured to drive a control terminal of the semiconductor device.

12. A driving method comprising:
driving, by a driving section, a control terminal of a semiconductor device according to a control signal input from an outside, the semiconductor device including a first main terminal, a second main terminal, and the control terminal that is configured to control a connection state between the first main terminal and the second main terminal that are connected in parallel with a snubber; and lowering a drive capability of the driving section during a period in which an inter-main-terminal voltage between the first main terminal and the second main terminal changes by a predetermined reference voltage difference owing to switching of the semiconductor device, compared with other at least some periods;

operating the drive control section to drive the control terminal at a first drive capability by the driving section while the inter-main-terminal voltage is less than a first threshold, and to drive the control terminal at a second drive capability higher than the first drive capability by the driving section when the inter-main-terminal voltage becomes equal to or higher than the first threshold, in a period in which the semiconductor device is turned off, and operating the drive control section to drive the control terminal at a third drive capability by the driving section while the inter-main-terminal voltage is equal to or higher than a second threshold, and to drive the control terminal at a fourth drive capability lower than the third drive capability by the driving section when the inter-main-terminal voltage becomes less than the second threshold, in a period in which the semiconductor device is turned on.

* * * * *